(12) United States Patent
Vollmerhausen

(10) Patent No.: US 10,871,642 B2
(45) Date of Patent: Dec. 22, 2020

(54) PLANE WAVE IMAGER WITH SYNTHETIC APERTURE CAPABILITY

(71) Applicant: Richard H. Vollmerhausen, Lake Mary, FL (US)

(72) Inventor: Richard H. Vollmerhausen, Lake Mary, FL (US)

( * ) Notice: Subject to any disclaimer, the term of this patent is extended or adjusted under 35 U.S.C. 154(b) by 0 days.

(21) Appl. No.: 16/916,027

(22) Filed: Jun. 29, 2020

(65) Prior Publication Data

US 2020/0370878 A1  Nov. 26, 2020

Related U.S. Application Data

(63) Continuation-in-part of application No. 16/673,917, filed on Nov. 4, 2019, now Pat. No. 10,698,195.

(60) Provisional application No. 62/755,457, filed on Nov. 3, 2018.

(51) Int. Cl.
| | |
|---|---|
| *G02B 23/24* | (2006.01) |
| *H01Q 3/26* | (2006.01) |
| *G01S 13/89* | (2006.01) |
| *H01L 27/146* | (2006.01) |
| *H01Q 21/06* | (2006.01) |

(52) U.S. Cl.
CPC .......... *G02B 23/2484* (2013.01); *G01S 13/89* (2013.01); *H01L 27/14643* (2013.01); *H01Q 3/2658* (2013.01); *H01Q 21/064* (2013.01)

(58) Field of Classification Search
CPC ........ G02B 23/2484; G02B 6/10; G02B 6/24; G02B 6/26; G02B 6/28; G02B 27/10–16; G02B 27/283–285; G01S 13/89; G01S 17/89; G01S 17/90; H01L 27/14643; H01Q 3/2658; H01Q 21/064
See application file for complete search history.

(56) References Cited

U.S. PATENT DOCUMENTS

| | | | | |
|---|---|---|---|---|
| 5,384,573 | A * | 1/1995 | Turpin | G03H 1/00 |
| | | | | 342/179 |
| 10,727,952 | B1 * | 7/2020 | Vollmerhausen | G01S 17/894 |
| 2009/0312188 | A1 * | 12/2009 | Duer | G01N 21/648 |
| | | | | 506/6 |
| 2013/0094077 | A1 * | 4/2013 | Brueck | G02B 21/0056 |
| | | | | 359/385 |
| 2018/0271498 | A1 * | 9/2018 | Guenther | G01S 7/52046 |

(Continued)

*Primary Examiner* — Antoinette T Spinks
(74) *Attorney, Agent, or Firm* — Wolter Van Dyke Davis, PLLC; John L. DeAngelis

(57) ABSTRACT

Plane Wave Imagers (PWI) directly sense the amplitude and phase of electromagnetic waves and do not require a lens to image a scene. PWI's can also be used in the exit pupil of an afocal lens. PWI's are implemented in CMOS using silicon waveguide technology. Since the wavelength of light ranges from less than one to tens of microns, PWI's fabricated on silicon are essentially flat plates, making a PWI a thin and light structure. A CMOS PWI can operate in the visible, near infrared, short wave infrared, and mid wave thermal spectral bands. Benefits of using a PWI include the ability to achieve large optical aperture performance by digitally processing the outputs of multiple small aperture PWI's that are not necessarily precisely optically aligned. Enhanced scene resolution can be obtained by collecting imagery from several adjacent positions and then digitally combining the digital data into one large dataset.

20 Claims, 13 Drawing Sheets

(56) References Cited

U.S. PATENT DOCUMENTS

2019/0129026 A1* 5/2019 Sumi .................. G01S 15/89
2020/0252535 A1* 8/2020 Vollmerhausen ..... G01S 7/4911

* cited by examiner

PLANE WAVE IMAGER WITH SYNTHETIC APERTURE CAPABILITY

CROSS REFERENCE TO RELATED APPLICATIONS

The present application is a continuation-in-part of application Ser. No. 16/673,917, filed on Nov. 4, 2019, now U.S. Pat. No. 10,698,195 which further claims priority, under the provisions 35 U.S.C. 119(e), to the provisional application filed on Nov. 3, 2018, and assigned application No. 62/755,457.

FIELD OF THE INVENTION

The Plane Wave Imager (PWI) of the present invention relates to electro-optical imaging, and more particularly to imaging without a lens or imaging in the exit pupil of a telescope with infinity focus.

Plane Wave Imaging also enables synthetic aperture addition. That is, digital image data of a scene, taken from multiple locations, can be combined to provide enhanced resolution of scene details.

BACKGROUND OF THE INVENTION

There is a need in the commercial, scientific, and tactical communities for high resolution imaging systems that are light weight and small in volume Eliminating the imaging optics elements reduces both the size and weight of high-resolution imagers.

Furthermore, the diffraction-limited performance that is theoretically possible with large optical apertures can be achieved by combining the digital image data from several small PWIs without the need for precise alignment of the individual PWI optical axes. Thus, performance equivalent to a large optical aperture is achieved by mosaicing many small PWIs.

BRIEF SUMMARY OF THE INVENTION

A PWI senses incoherent light. Sunlight, starlight, light bulbs, arc lamps, light emitting diodes all emit incoherent light. Thermal emissions in the mid wave, long wave, and extreme infrared plus passive terahertz and millimeter wave are also all incoherent and can be imaged by a PWI.

If incoherent light is split into two light streams, and the path lengths of both streams are nearly equal, then the intensity of the interference pattern in a phase-comparator depends co-sinusoidally on the delay between the two light streams, and the delay is proportional to the path length difference between the two light streams. See FIG. 5 where the abscissa is optical path length difference and the ordinate is intensity (normalized amplitude). As the optical path length difference varies from zero to one wavelength (a phase angle difference of 2*pi radians), cross-correlation of the two light streams results in a cosine variation from double incoherent intensity to zero and back to nearly double incoherent intensity again.

Since light is a periodic wave, one wavelength is often associated with $2\pi$ radians, and the optical path length difference in radians is referred to as phase angle difference. The graph in FIG. 5 is for light with a coherence length of about 7 wavelengths. That coherence length might represent a passive mid wave infrared imager with a 4.4 to 4.7 microns spectral band.

Light consists of a series of electromagnetic waves 12 in FIG. 6. The individual waves 13 travel in the direction of a Poynting Vector 14, which is normal to the plane wave surface as illustrated in the FIG. 6. That is, a reference numeral 7 in FIG. 4 is in the direction of the Poynting Vector 14 in FIG. 6.

While the Poynting Vector indicates the direction of energy flow, an electric field 15 is the property of light that generates photo electrons in photo detectors. The electric field 15 is the property used to describe light behavior in waveguides and photo detectors. If there is little energy loss during light propagation, then the electric field 15 is perpendicular to the Poynting Vector 14. The electric field always lies in the plane of the electromagnetic wave.

The electric field 15 in FIG. 6 varies in amplitude and orientation (i.e., polarization); FIG. 6 shows a snapshot in time. A magnetic field 16 in FIG. 6 is perpendicular to the electric field 15. Reference character 17 represents a wavelength of the light. However, the E field (electric field) has the same instantaneous amplitude and angular orientation (polarization) at every point on the plane wave. That is, light captured at two points distant from each other and on a line that is parallel to the plane wave will exhibit full intensity cross correlations.

That is, light captured from different points on the same plane wave or one of the plane waves in sequence 12 of FIG. 6, behaves like splitting one light stream into two parts. Light from different parts of the same train of waves temporally correlates.

In FIG. 7, a plane wave 13 is tilted with respect to a PWI surface 11. Reference characters 19 A, B, and C identify line segments normal to the plane wave surface (and therefore in the direction of travel of the light) and terminating at different points on the PWI surface 11. The lengths of line segments 19A and 19B are almost equal and both are longer than 19C. The optical phase difference between 19A and 19C is larger than the phase difference between 19A and 19B. Using the relationship illustrated in FIG. 5, a comparison of the phase angle differences can be used to establish the angle between the plane wave 13 and the PWI surface 11.

A scene consists of many points radiating or reflecting light. The scene light irradiating each point on the PWI surface is the sum of all the contributors arriving at that point. Further, the juxtaposition of the individual plane waves varies from point-to-point across a PWI surface. Each scene generates a unique combination of plane waves impinging on the PWI surface. If we could measure the phase of light across the surface that would allow the calculation of an image of the scene by taking a Fourier Transform. However, the phase of light impinging a surface changes too rapidly to easily measure it. Instead, the imager described in this patent measures the phase difference of the light arriving at many points on the PWI surface. The image can also be calculated using the phase difference data. The phase differences are measured by streaming light from adjacent points on the PWI surface through an evanescent coupler (also called a splitter or a phase-comparator because it can provide each of these functions). The evanescent couplers have the property that temporally coherent light in the two coupler branches exits the two branches in a ratio that depends upon the phase difference of the light in the two coupler waveguides. The evanescent coupler/splitters are also referred to in this patent as phase comparators.

FIG. 1 compares a traditional camera 6 to a PWI camera 1. The traditional camera has a lens 8 that forms a real image in a focal plane 5. A focal plane array of photo detectors 18 is placed in the focal plane to convert the real image into electrical signals 18A that are output to a display (not shown).

By comparison, the PWI 1 is a thin square substrate supporting a plurality of light collection sites; it is a complete camera capable of imaging the scene with resolution commensurate with the theoretical limit that is based on the area of the array, that is, the product of the two larger dimensions. The PWI electrical output signal 1A represents the image.

FIG. 2A illustrates a single PWI. Four PWIs are combined to form a larger aperture in FIG. 2B. The four PWIs image the same field of view (that is, the same portion of a scene). Each PWI creates an image with a resolution commensurate with the diffraction limit that is based upon its individual single PWI physical size. But combining the data from the four PWIs doubles the image resolution, both horizontally and vertically, because the effective optical aperture size doubles in both directions.

Because alignment of the multiple PWIs during operation is not critical, FIG. 2B shows the PWIs mounted with hinges 3 that allow the multiple PWIs to collapse (as indicated by arrowheads 5) into a small package 4 of FIG. 2C.

FIG. 3 illustrates the capabilities of a PWI synthetic aperture. Details such as sensor stabilization that are necessary for field operation of the PWIs are not shown. In FIG. 3, a plurality of PWIs 1 form a PWI array 21. In this example, the PWI array 21 comprises 16 PWIs. If each individual PWI is 1 inch on edge, then the PWI array 21 provides an aperture of 8 inches in one dimension and 2 inches in the other dimension. Making use of the synthetic aperture capability of PWIs, the forward motion (indicated by arrowheads 24) of an unmanned or manned aerial vehicle 25 situates the array of PWIs at different positions relative to the scene. Processing the image data from the PWI array provides effective resolution of the scene equal to the diffraction limit of an 8 square inch aperture in one direction and an extended aperture limited by stabilization data or processing capability in the other direction.

FIG. 4 shows a PWI disposed in the exit pupil of a telescope (also called an afocal lens). An objective lens 8 with optical axis 8A focuses light 7 onto an image plane 5. A field stop 9 sets the field of view of the telescope. That is, the field stop establishes that part of the scene that is viewed by the telescope. The eyepiece 10 re-collimates the light before impinging upon the PWI surface 11.

The PWI 1 in FIGS. 1 and 2 comprises an entire camera. The PWI surface 11 in FIG. 4 is the plane surface that receives light.

The benefits of using a telescope with a PWI are the resulting large optical aperture plus an adjustable field-of-view size. Another benefit of using the PWI is that re-imaging optics are not needed to provide an electronic output for display.

DETAILED DESCRIPTION OF THE INVENTION

Figure 1:
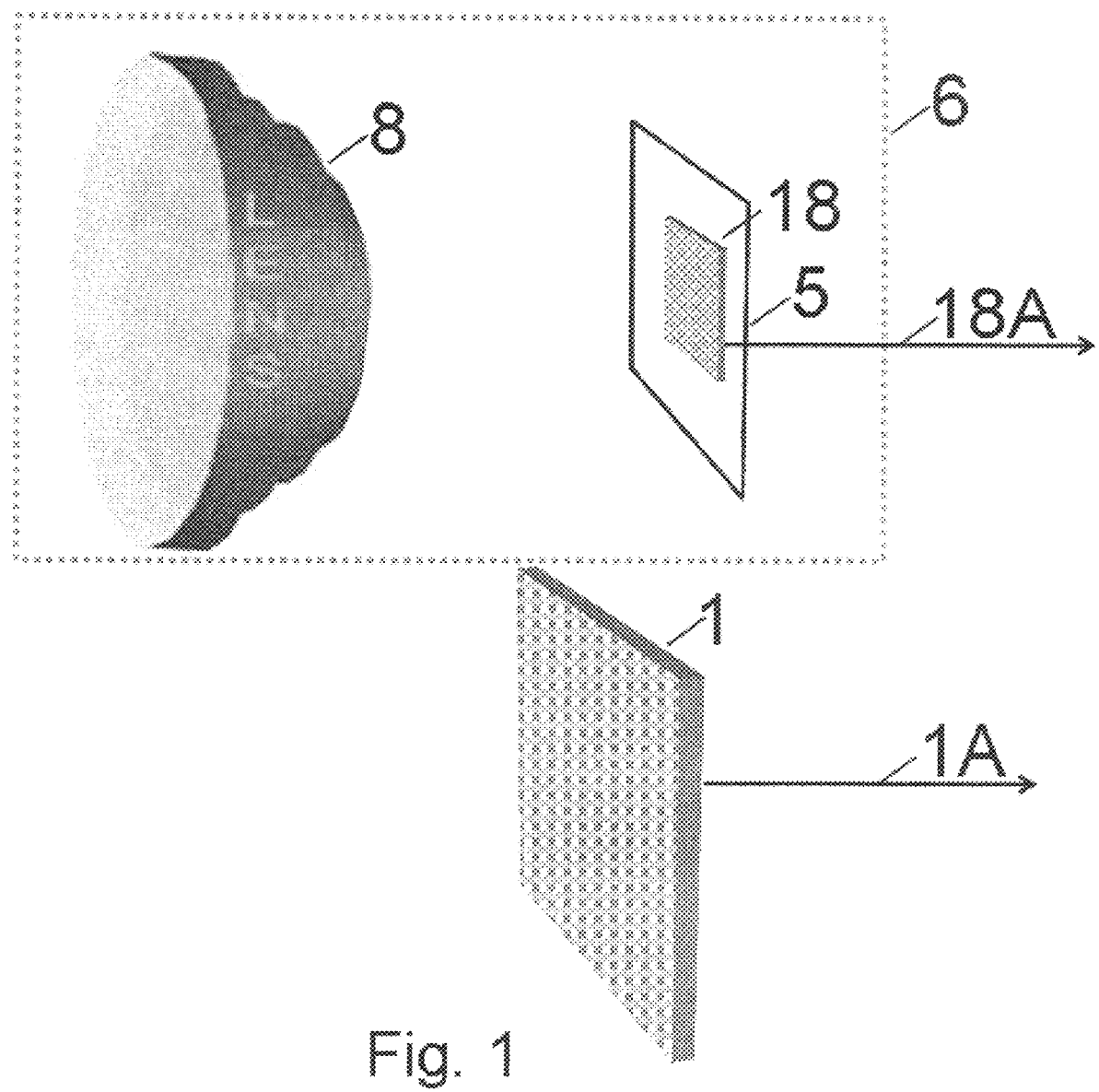
FIG. 1 compares a traditional camera that use a lens with a PWI camera.

A more complete understanding of these embodiments, and the attendant advantages and features thereof, will be more readily understood by reference to the following detailed description when considered in conjunction with the accompanying drawings.

The drawings described herein are for illustrative purposes only of selected embodiments, and not all possible apparatus configurations are shown. The drawings are not intended to limit the scope of the present disclosure.

The invention has the potential to be configured in multiple versions so as to generate superior technical performance in any given application. Therefore, it is understood that in some configurations not all elements will always be necessary for the specific embodiment or implementation of the invention. It should also be apparent that there is no restrictive one-to-one correspondence between any given embodiment of the invention and the elements in the drawing.

For clarity and in order to emphasize certain features, all of the invention features are not shown in the drawing, and all of the features that might be included in the drawing are not necessary for every specific embodiment of the invention. The invention also encompasses embodiments that combine features illustrated in the drawing; embodiments that omit, modify, or replace some of the features depicted; and embodiments that include features not illustrated in the drawing.

As used herein, relational terms, such as "first" and "second," "top" and "bottom," and the like, may be used solely to distinguish one entity or element from another entity or element without necessarily requiring or implying any physical or logical relationship or order between such entities or elements.

The figures are integral to the application and are included by way of illustrating various embodiments and components of the PWI array.

Implementation of an imaging camera requires circuitry for synchronization, global or progressive shutter logic, row and column read-out, analog-to-digital conversion, non-uniformity corrections, and display formatting, to name some of the necessary functions. Solutions implementing those and other required camera and imaging functions are well known to those skilled in the camera art. This disclosure focuses on teaching and instructing PWI implementation methods to those already expert in camera design.

The preferred embodiment is implemented using photonics waveguide technology fabricated on a suitable substrate.

The known waveguide art is too diverse and has too many varieties to list, but the availability and conventional functionality of the waveguide components used in the current invention are known to those skilled in the art, albeit assembled into a novel and non-obvious system of the present invention.

One technology suitable for implementing a PWI is silicon or silicon nitride waveguides fabricated using a complementary metal oxide semiconductor (CMOS) processes on silicon or silicon on insulator (SOI) wafers. Because silicon technology is in widespread use and is well understood in the technical community, silicon photonics examples are used to explain PWI operating principles and to provide examples of a PWI implementation.

Figure 8:
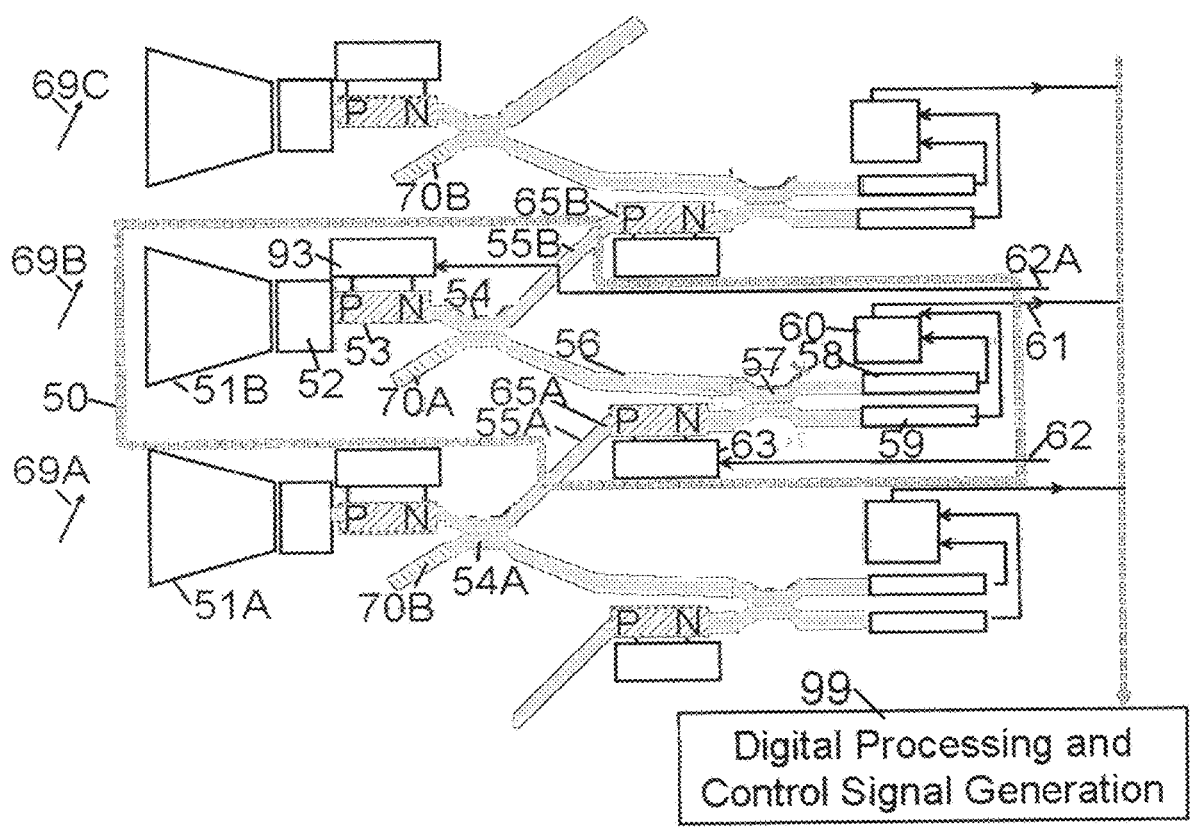
FIG. 8 shows the main components of a PWI light collection site (LCS).

The invention described herein comprises a two-dimensional array of light collection sites (LCS). The functional components of each LCS are illustrated in FIG. 8. The dotted outline bounds one complete LCS 50; parts of adjacent LCSs are included in FIG. 8 to show how the LCSs are interconnected.

Figure 7:
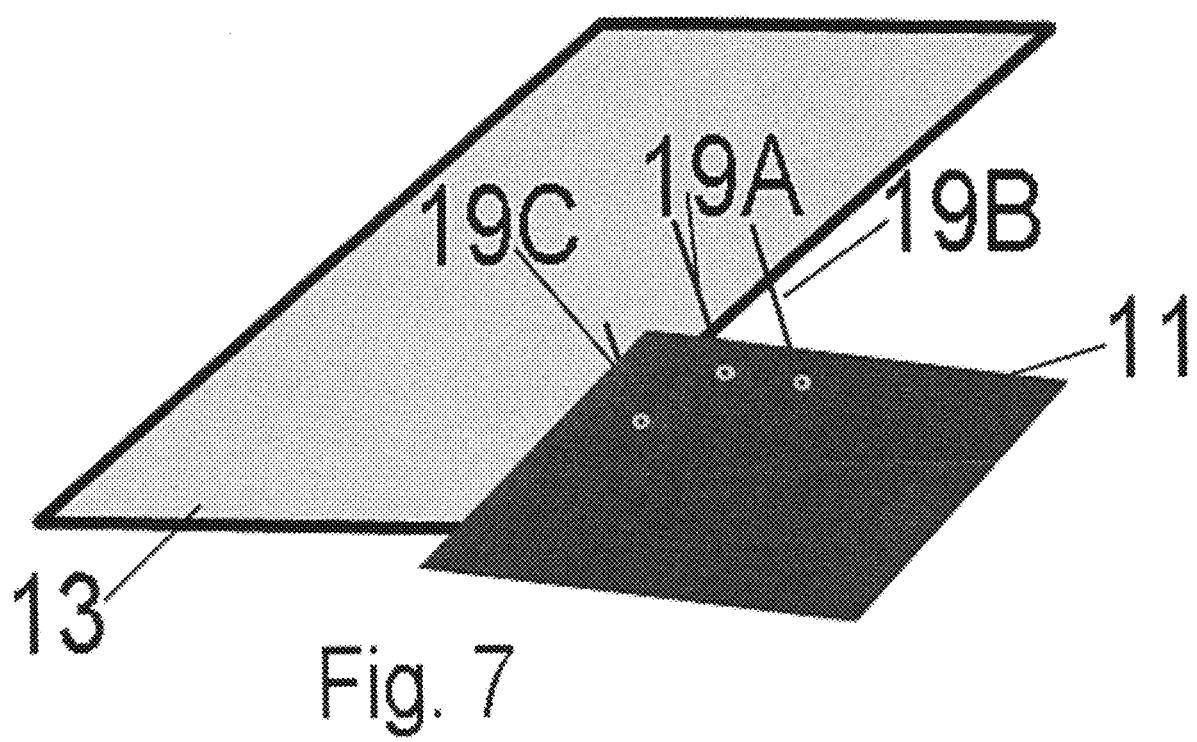
FIG. 7 illustrates that the phase of light varies over the PWI surface if the light arrives non-normally.

FIG. 8 shows three adjacent LCS along a row or a column of a PWI array. The LCS are on the surface of the PWI that is labeled 11 in FIG. 7. All of the elements of one LCS are labeled and described, but different labels are given to similar elements in adjacent sites so that signal flow can be explained. The one complete and labeled LCS is outlined by a dotted line and identified by reference character 50.

A plane wave with instantaneous E field 69A, 69B, and 69C impinges upon a PWI LCS array. The E field is the same at every point in the plane wave; that is, wave representations 69A, 69B, and 69C all share amplitude and orientation (polarization) within the plane of the wave. If the light 69A, 69B, and 69C is arriving at an angle to the PWI LCS array, then the phase difference between 69A, 69B, and 69C can be used to determine the angle of arrival of the light. There are many light plane waves arriving at the PWI array from many angles, and there are many LCS measuring phase differences across the PWI surface 11 in FIG. 7. At each LCS, the phase measured between adjacent LCS's is based on all of the light arriving at those two LCS's. An image of the scene can be calculated from the phase data set collected from all the LCS's.

In order to measure the phase difference between adjacent LCS, scene light is collected by a coupler 51B, converted by a polarization diversifier 52, passed through a PIN diode 53 controlled by a circuit 93. Now the single mode light exiting the splitter 54 is coupled to a waveguide 55B with an embedded PIN diode 65B. Similar light arrives in an LCS 50 from an adjacent LCS into waveguide 55A and PIN diode 65A. The polarization diversifier 52 converts all polarizations of the incoming light to one electromagnetic mode. Forward current in the PIN diode 65A is controlled by a circuit 63. Typically, the circuits 63 and 93 are current mirrors that provide a steady current based upon an applied voltage. In the case of the PIN diode 65A, the control voltage is provided by placing a voltage on a conductor 62.

The light traveling from the polarization diversifier 52 goes through the splitter 54, and half of the light then goes to the waveguide 55B and the other half goes to splitter 57 (operating as a phase comparator) via waveguide 56. Light from an adjacent LCS also arrives at 57 via waveguide 55A.

As long as the light 69A and 69B travel over equal optical path lengths, their phase difference at phase comparator 57 can be used to determine the angle of arrival of the light. If there are many light plane waves impinging on the LCS array, then the phase difference between 69A and 69B will contribute only partly to the phase angle measured at the LCS 50. The phase angle measured at the splitter/phase comparator 57 in the LCS 50 depends upon all of the light impinging on collector horns 51B and 51A. The means of measuring phase in each LCS is described next, and the means of obtaining an image from all LCS data is described later.

Since fabrication tolerances and temperature differences across the LCS array lead to optical path length differences, the current in the PIN diodes is adjusted to equalize the optical path lengths from 69A and 69B to phase comparator 57.

At the phase comparator 57, each plane wave of light interacts only with itself, because there is no correlation between incoherent light waves generated at different points in the scene.

Further, evanescent splitters/couplers/phase-comparators have the behavior that light jumping to the non-input waveguide is delayed 90 degrees or pi divided by two radians. The fact that light arriving at phase comparator 57 via waveguide 56 underwent a phase jump and light arriving via waveguide 55A did not is unimportant, because that fact can be accounted for in the algorithm used to calculate the image.

Splitter/phase comparator 57 is an evanescent coupler with the following behavior. If the light 69A and 69B arrive at 57 is in phase, then E field summation shows that the light will be split equally between the photo diodes 58 and 59. If the light from waveguide 56 lags the light from waveguide 55A by 90 degrees (or pi divided by two radians), then all of the light will transfer to photo diode 58. If the light from waveguide 56 leads the light from waveguide 55A by 90 degrees (or pi divided by two radians), then all of the light transfers to photo diode 59. Phase differences between these two values, lead to proportional splitting of the light between photo diodes 58 and 59. That is, the signal collected by photo diodes 58 and 59 indicates the relative phase of light entering the two arms of splitter/phase-comparator 57.

Still referring to FIG. 8, the two output arms extending from 57 feed photo diodes 58 and 59. A circuit 60 buffers the electrical output of the photo diodes 58 and 59, producing an output analog signal 61, which is connected to a digitizer and subsequently a processor 99.

There are two PIN diodes with separate control circuits in each LCS because the optical path lengths from the couplers 51A and 51B to splitter/phase comparator 57 should be equal or nearly equal, and the same is true for the adjacent LCS's.

In the PWI, only light streams from adjacent LCSs are compared. The optical path length differences between light streams are therefore small. Keeping these physical path length differences small makes it easier to zero-out the optical path length differences using the PIN diodes.

The PWI forms images by using the data from the two arrays of photo diodes 58 and 59 (in the LCS 50) as input to a two-dimensional Fourier Transform (FT). The image of the scene is the absolute value of the FT.

Practical implementations of many functions needed in a PWI or any camera are well known to experts in the electro-optical imager field. For example, there are many known ways to implement functions like time multiplexing the electrical signals 61 in FIG. 8, digitizing these signals, interfacing the signals to a digital processor, and formatting output signals for a display. Electrical circuits to generate voltages suitable for driving the voltage inputs 62 and 62A in FIG. 8 and then time multiplexing the correct voltages or settings to each LCS in a two-dimensional array are also needed camera functions with known solutions. This disclosure focuses on PWI implementation and does not describe camera details when the details are known to those skilled in the art.

However, some of the generic rules governing camera design are different for a PWI (such as the PWI 1 in FIG. 1) and typical lensed-cameras (such as the camera 6 in FIG. 1). Also, production tolerances sometimes affect PWI performance differently than lensed-camera performance.

Figure 2A:
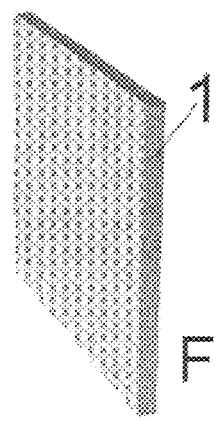
FIG. 2A illustrates a single PWI.
Figure 2B:
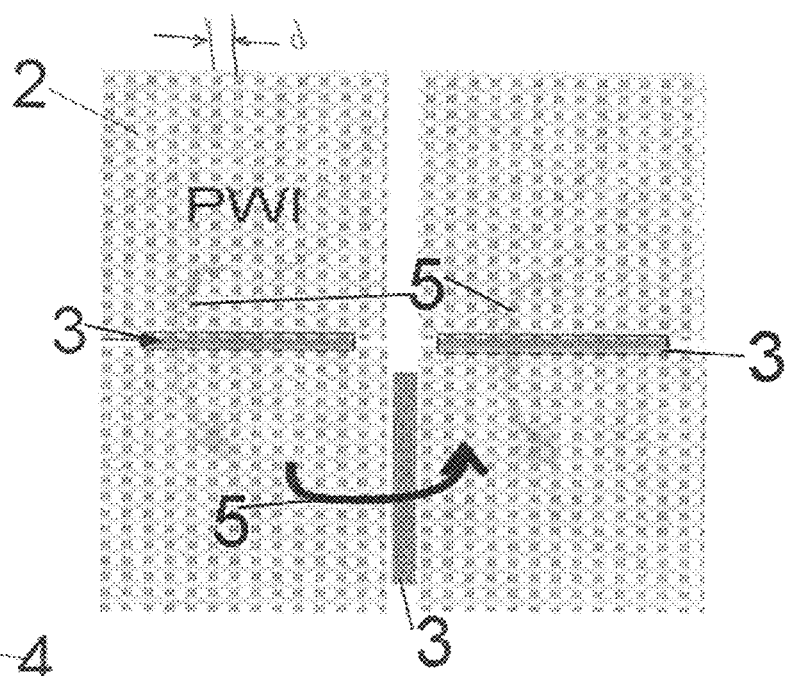
FIG. 2B illustrates four PWIs.
Figure 2C:
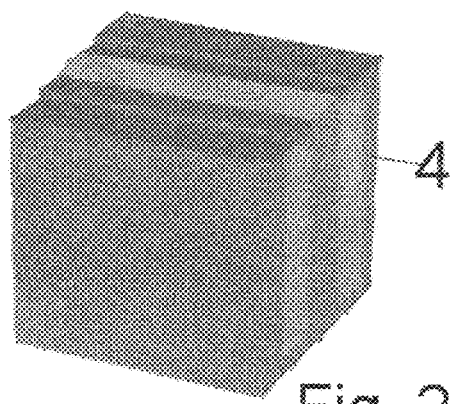
FIG. 2C illustrates a package configuration of the four PWIs of FIG. 2B.
Figure 3:
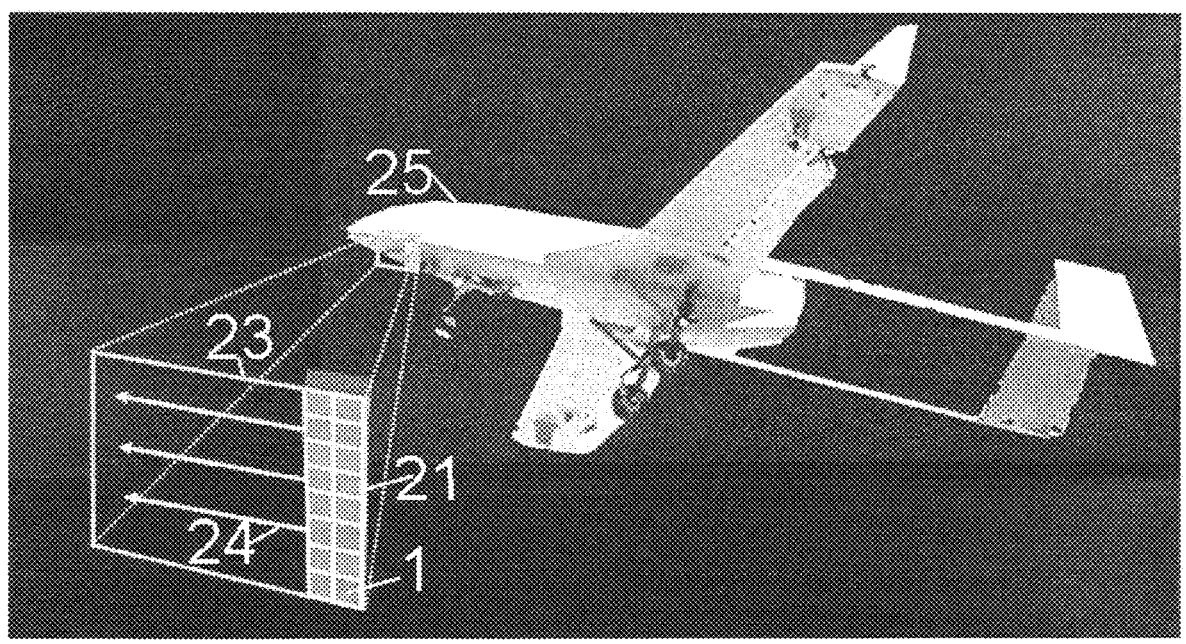
FIG. 3 illustrates synthetic aperture addition using motion to increase optical aperture size.
Figure 4:
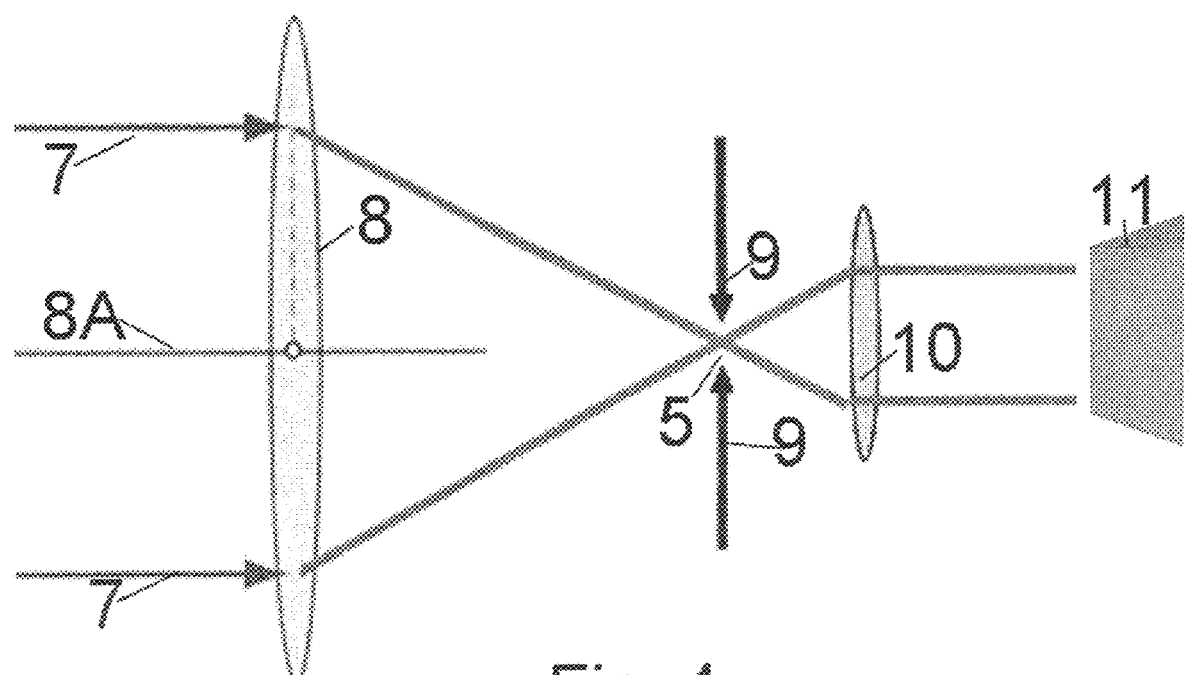
FIG. 4 shows a PWI in the exit pupil of a telescope.

A field of view of lensed-cameras 6 is set by that portion of the image plane covered by the focal plane array 18 in FIG. 1 or the size of the field stop 9 in FIG. 4. For a PWI, the field of view is established by the ratio of wavelength λ to LCS pitch d (a distance between adjacent PWIs, see FIG. 2) establishes the field of view. Light arriving at angles greater than the field of view is imaged in the field of view. That is, like radar, a PWI has side lobes.

In a lensed-camera 6 in FIG. 1, the pitch of the photo detectors on array 18 sets the camera resolution. With a PWI, the dimension of plane 11 (see FIG. 4) establishes the resolution.

Figure 5:
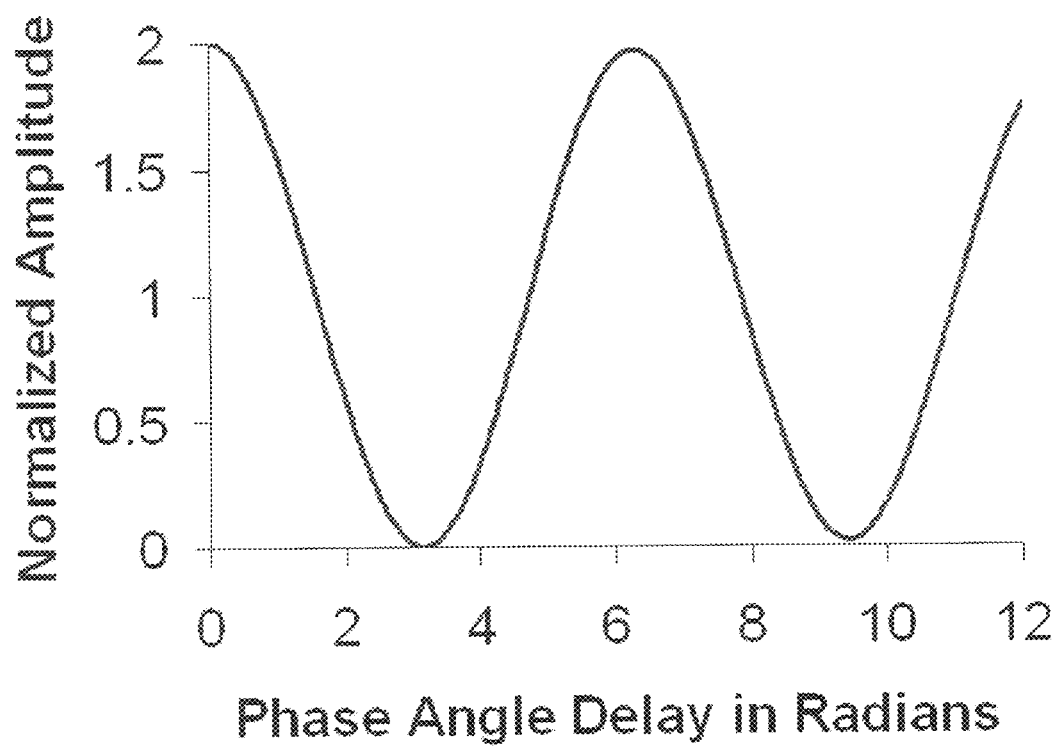
FIG. 5 is a plot of the cross-correlation of light with a delayed version of itself.
Figure 6:
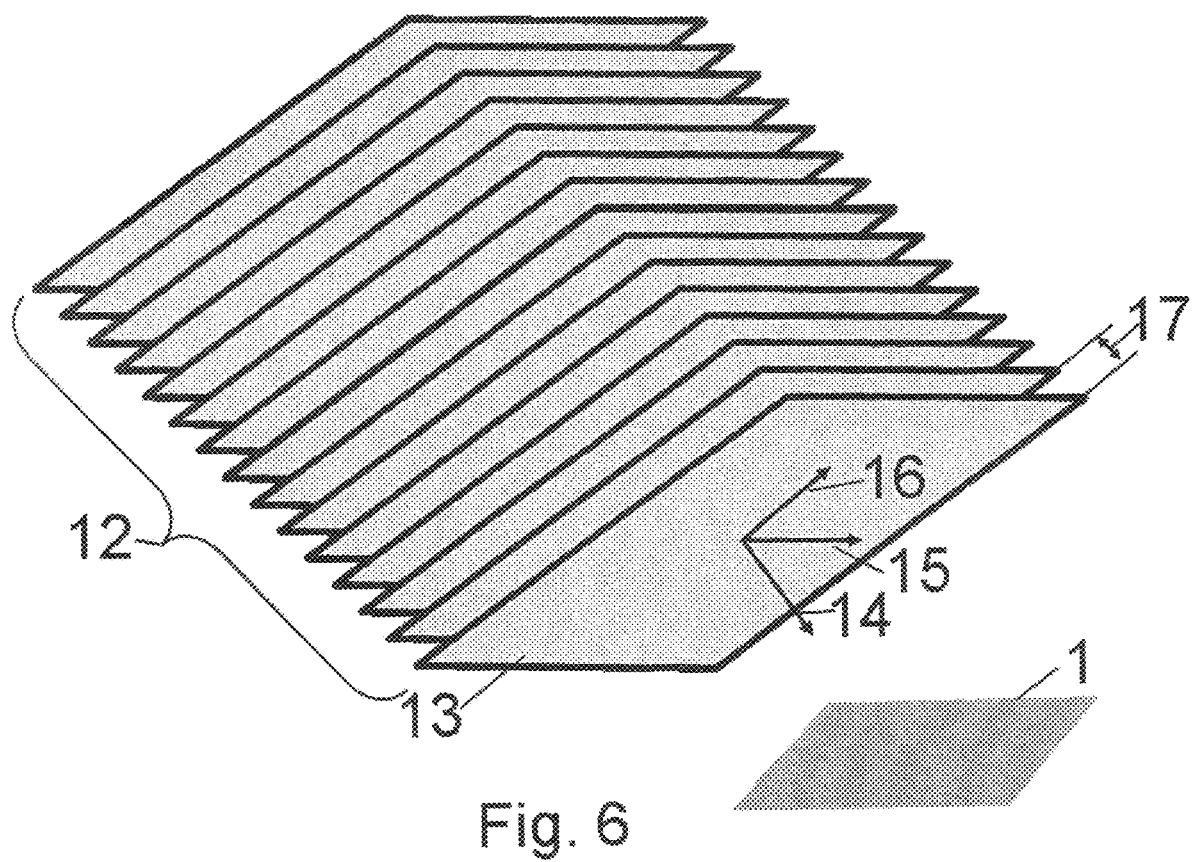
FIG. 6 shows the relationship between the direction of light energy flow and the light's electric field.

A PWI uses a temporal coherence concept to image the scene. That is, FIG. 5 shows the result of a time-slip or phase difference between closely adjacent plane wave electric fields. But FIG. 5 holds only for near-equal time offsets, whereas the light travels many wavelengths over the optical path from couplers 51 to the splitters 57 and 54 shown in FIG. 8. Fabrication differences, material aging, and temperature variations make it unlikely that the two path lengths will be sufficiently equal for PWI imaging if the optical path lengths are not corrected. For best results, the path lengths should be equal to within a standard deviation error better than 0.5 radians, with 0.05 radians desirable.

Properties of PWI imaging can be used to ensure photo detector response uniformity and to establish the needed near equality of optical path lengths. The next few paragraphs describe data collection for non-uniformity of the photo detector responses and for maintaining equal optical paths.

$$\text{PWI field of view} = \phi_{max} = \sin^{-1}(\lambda/d).$$

One PWI property useful for non-uniformity correction is that the direct detection signals are equal across the PWI. If the current in the PIN diodes 53 and 65B in FIG. 8 is set to ensure that the optical path lengths of adjacent LCS are not equal (such that they do not correlate), then the outputs of photo detectors 58 and 59 become be equal. Time is taken between imaging sequences to gather data of photo detector non-uniformity for use in correcting the signal intensities gathered during imaging.

There are a number of factors that contribute to intensity non-uniformity. It is not necessary to measure all of those factors, but the coupling efficiency from both the horns 51A and 51B to photo detectors 58 and 59 should be known in order to image uniformly.

Light from light emitting diodes, quantum dots, or other light source is supplied to each LCS at inputs 70A and 70B in FIG. 8. The light at 70A and 70B is generated separately and the intensity controlled separately. There must not be coherence between the light introduced at 70A and 70B. Every other LCS in a row or column is treated like 70A and the adjacent LCS like 70B. The light supplied to the inputs 70A and 70B can be on separately (when one is on the other off), both off, or both on.

The light introduced at all 70A and 70B in the array is strong enough to dominate scene light.

In the following, the PIN diode 53 controlled by circuit 63 is either engaged strongly on or off such that light from adjacent LCS does not correlate. Data from photo diode arrays 58 and 59 is then taken when light is supplied to both inputs 70A and 70B and data is taken when the inputs are separately illuminated. The gathered data is used for non-uniformity correction as described in the following paragraphs.

Light introduced separately in the inputs 70A or 70B (in other words, one is lit and the other dark) is used to record how much light is split in splitter/phase detector 57 to photo detectors 58 and 59 in each LCS. Separating the light introduction also allows measurement of the split ratio of 54 by comparing the photo diodes between LCS's. Introducing light into both 70A and 70B simultaneously once the individual data are gathered completes the information needed to characterize uniformity of all optical and electrical circuits past the polarization diversifier 52.

Uniformity correction that includes the couplers 51, polarization diversifier 52, and the splitter 54 and 54A compares the response of the photo diodes 58 and 59 (corrected to the extent possible at this point). As long as the PIN diodes are set to ensure no correlation between light from adjacent LCS, (that is all PIN diodes are either off or driven with large currents), the photo diodes should all have the same current.

The non-uniformity data collected as described in the last several paragraphs supports correcting the gain response of all the photo detector channels. Further, the data supports calculating the output ratio of the optical splitters. The splitter output ratio is important because, if the ratios are not equal, then some of the light does not contribute to the phase angle signal. That light is split equally in the photo diodes 58 and 59, thereby causing a phase error. Knowing the output ratios of the optical splitters, the phase errors can be corrected by adjusting the currents of the photo diodes 58 and 59.

After the non-uniformity corrections, the optical paths are maintained for each LCS by continuously monitoring the signals from photo diodes 58 and 59 and adjusting the control PIN diode signals 62 and 62A to maintain a maximum difference in the signals from the photo diodes 58 and 59.

The couplers 51A and 51B serve two functions. One function is to efficiently gather light from the scene. The second function is to suppress the side lobe response.

Figure 9:
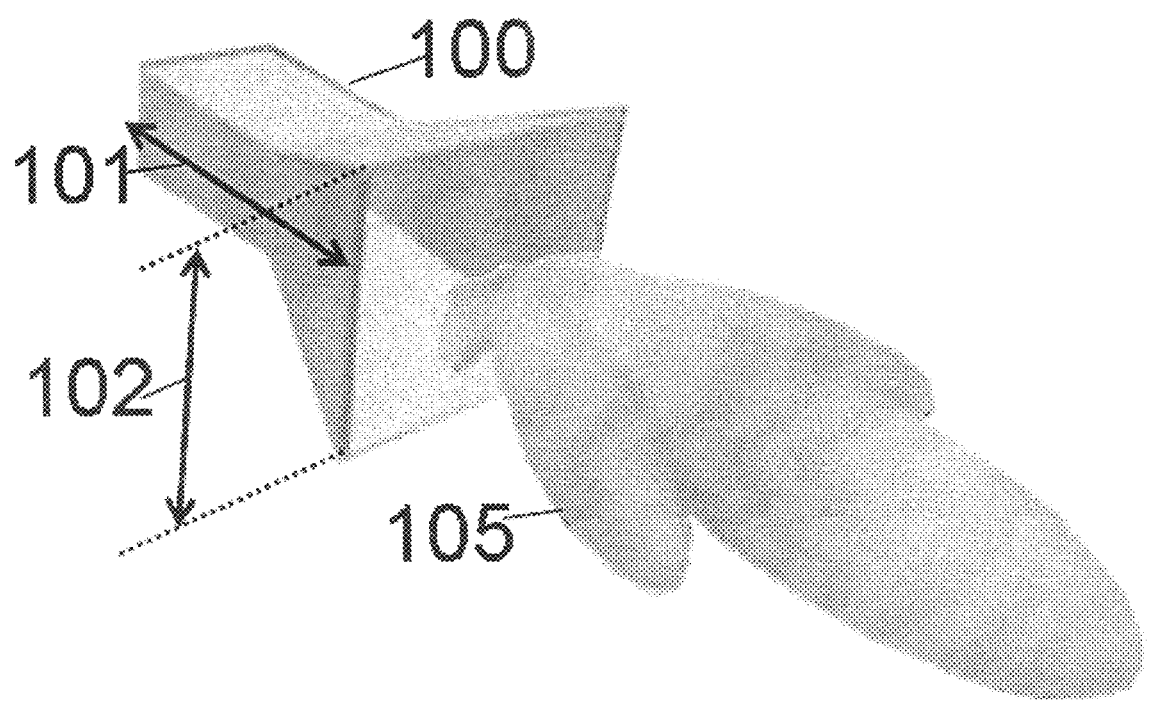
FIG. 9 illustrates a horn antenna and antenna gain pattern.

Horn antennas that operate at radio and millimeter wave wavelengths demonstrate that electromagnetic plane waves can be coupled efficiently into a single mode waveguide. FIG. 9 shows a horn antenna 100 and the associated gain pattern 105. The length of the gain pattern versus angle indicates E field amplitude gain. Horn length 101 and height 102 and other shape factors control gain and therefore side lobes.

Figure 10:
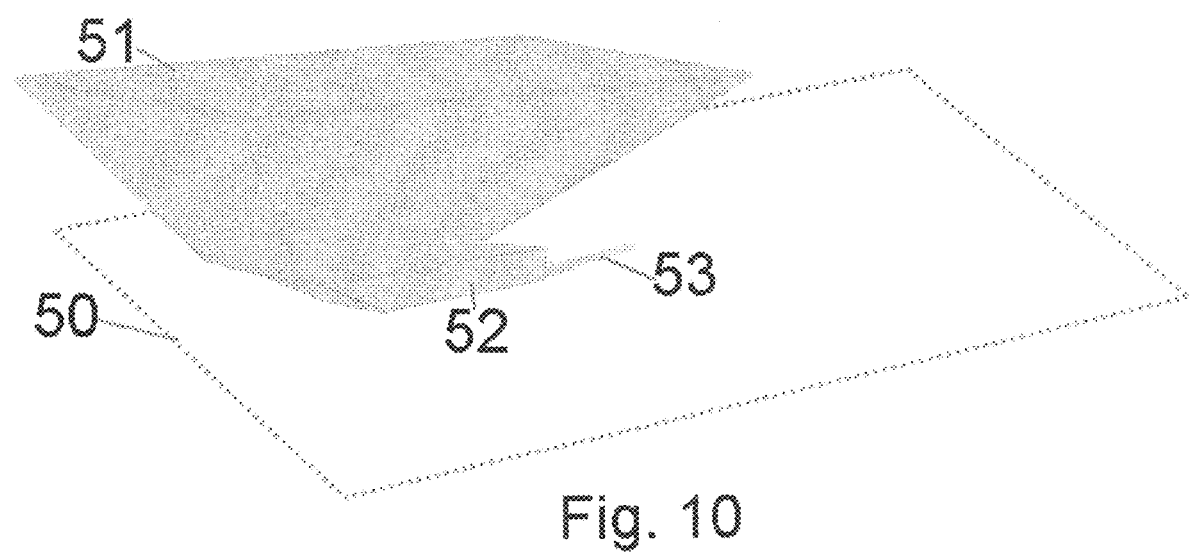
FIG. 10 illustrates a plane wave-to-waveguide coupler horn etched from silicon.
Figure 11:
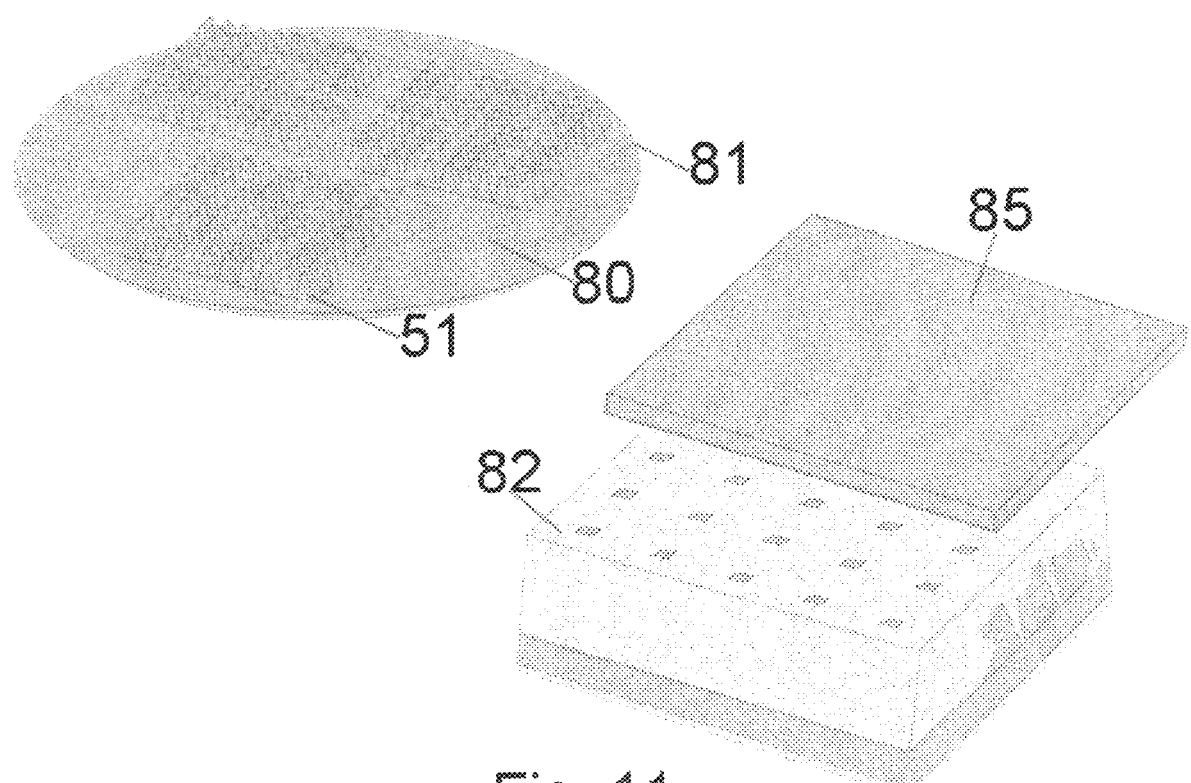
FIG. 11 illustrates a second horn coupler fabrication method.

FIGS. 10 and 11 are included as examples of possible implementation of the present invention in CMOS.

FIG. 10 illustrates a coupler 51 fabricated by depositing silicon on top of a polarization diversifier 52 that is coupled to a waveguide 53. The shape of the gain pattern in FIG. 9 and side lobe rejection depends on the slope angle and contours of the etched shape 51. Etch processing details to optimize side lobe rejection can be refined over time. The polarization diversifier 52 has a slanted mirror etched into the receive end to turn the scene light parallel to the photonics wafer.

FIG. 11 shows an alternative silicon implementation. The horns 51 are etched to receive light through the silicon wafer substrate 80 (that is, the array is back illuminated). The back surface has an anti-reflection coated 81 to improve collection efficiency. One possibility for connecting the horns to the photonics wafer 85 is to planarize the etched horns with silicon dioxide or benzocyclobutene and then press fit the photonics wafer 85 with diversifier, splitters, electronics circuits, and other components described herein. In other words, butt couple the horns 51 to the polarization diversifiers 52, for example. (The flip side of the photonics wafer is identified by a reference character 85.)

Most of the silicon waveguide components described herein, e.g., splitters, PIN diodes, polarization diversifiers, and waveguide coupled photo diodes have been widely demonstrated in CMOS. The ability to etch various shapes in silicon has also been demonstrated. Certainly, a PWI according to the invention will require process development to refine etch materials and times, for example, but the feasibility of PWI CMOS fabrication is supported by existing research and products.

Processing is required to form an image from the LCS data. Processing is also required to implement synthetic aperture addition. Fourier Transform (FT) methods are used to calculate the image from the LCS data. All of the known FT techniques, such as improving dynamic range by using windows or zero padding the data to decrease the size of the frequency bins, can be applied to the PWI processing of this invention.

Two PWI arrays, each with two dimensions, are needed to calculate an image using a FT. The data from the photo diode 58 in each LCS forms one array, and the data from the photo diode 59 in each LCS forms the other array. For example, the output from all photo diodes 58 serves as the real data and the output from all photo diodes 59 as the imaginary data; both are input to a discrete FT to generate the image.

Image resolution is enhanced by synthetic aperture addition. If the PWIs are separated by a known distance PD in the X dimension and QD in the Y dimension, and the normal vector from all PWIs are accurately aligned in parallel, then the Fourier Transform of the combined PWI array of sensors is given by the equation $$DFT_{all} = \sum_P \sum_Q DFT_{P,Q} \exp^{-if_{PWI}^x PD} \exp^{-if_{PWI}^y QD}.$$

$DFT_{P,Q}$ represents the DFT data at position (P,Q), and $DFT_{all}$ is the data for the final discrete transform.

The above equation assumes that all of the PWI are precisely aligned and that the relative spatial positions of $DFT_{P,Q}$ are known.

If the precise alignment between individual PWI is not known, then cross-correlating the individual images provides offset and tilt information. The individual DTF arrays are corrected for offset and tilt using commonly known FT theorems. That is, all the DFT arrays are placed in a common coordinate system. Once the individual DFT are in a common coordinate system, they are combined into a large DFT array and transformed to yield the synthetic aperture image using the above equation.

Note that, due to tilt errors, the processing reduces both field of view and resolution. Tilt errors reduce the field of view because some parts of the field of view are not imaged. Resolution decreases because there are fewer frequency bins in the FT.

For example, a tilt error of one tenth of the field of view leads to a 0.1 loss in field of view and a 0.1 loss of frequency cutoff.

First Alternative Implementation

The invention embodiment described above requires the optical path lengths the light travels from couplers 51A and 51B to interferometer splitter 57 in FIG. 8 to be equal to within a small fraction of a wavelength. The PIN diodes 53 and 65A are included in the LCS to ensure equal path lengths.

Maintaining equal path lengths is difficult due to manufacturing tolerances and thermal gradients across the photonics circuit elements of FIG. 8. This first alternative implementation as described in this section is less susceptible to optical path length variations.

The alternative embodiment described in this section uses the same LCS implementation as shown in FIG. 8 except for a change in LCS electronics circuit 60. The alternative implementation described here also involves changing the drive signals 62 and 62A that control the state of PIN diodes 53 and 65A in FIG. 8.

Figure 12:
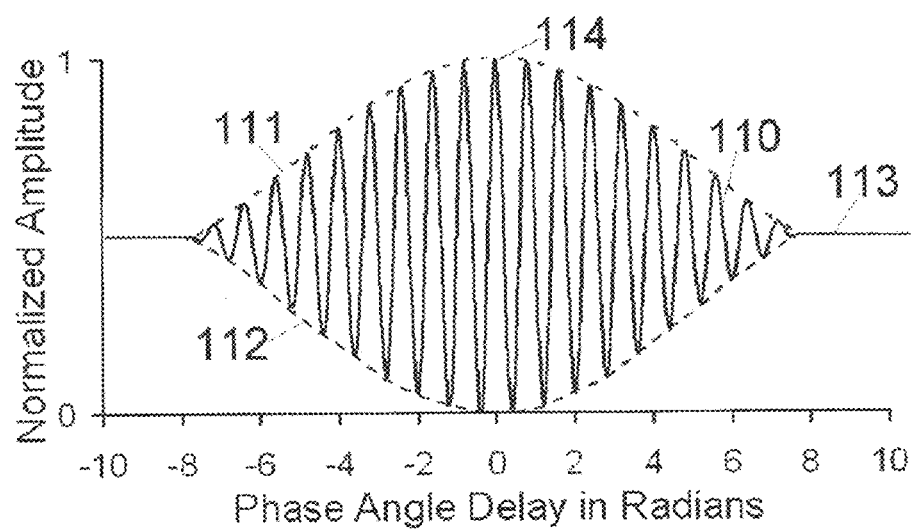
FIG. 12 is a plot of the intensity amplitude when light is cross-correlated with a delayed version of itself, showing a longer time delay than in FIG. 5.

FIG. 12 shows a cross correlation of two light streams split from the same light source. With large delays, the two light streams add incoherently. In FIG. 12, amplitude 113 represents incoherent addition, Continuing with FIG. 12, when the delays between light streams are small, an alternating signal 110 develops in photo diode 58 that varies between envelopes 111 and 112 and peaks at 114 when the two light streams are perfectly aligned in time.

In FIG. 8, light that is not directed to photo diode 58 is directed to photo diode 59. Photo diode 58 is mentioned in the last paragraph because the peak signal 114 is achieved in photo diode 58.

The invention embodiment described above controls the current in PIN diodes 53 and 65A to maintain the light streams aligned in time such that the signal peaks (or is approximately peak) as shown by 114 in FIG. 12.

Rather than maintain the cross-correlation signal in splitter 57 at peak, the implementation described in this section varies the signals that drive signals 62 and 62A in FIG. 8 such that the delays vary over the range of coherent interference as defined by envelopes 111 and 112.

The electronic amplification in the circuit 60 of photo detectors 58 and 59 is now alternating current (AC) coupled. During the non-uniformity correction (NUC) cycle, the range of current in PIN diodes 53 and 65A that result in the joining of the two ends envelopes 111 and 112 to each other and to voltage level 113 are found.

During image capture, the currents in 53 and 65A are varied by varying control signals 62 and 62A such that photo detectors 58 and 59 see the AC signal illustrated in FIG. 12. This invention implementation measures the average AC signal 110 illustrated in FIG. 12 rather than the peak 114.

A stronger AC signal can be generated in photo diodes 58 and 59 by limiting delays to values near the peak 114 in FIG. 8.

Second Alternative Implementation

The invention described in this application uses the property of light illustrated in FIGS. 5 and 12 to image a scene. The described embodiments cross-correlate signals from adjacent LCS to find the (amplitude, phase) differences across the LCS array, and then transform that data to generate an image of the scene.

The two invention embodiments described above use the fact that the evanescent splitter 57 in FIG. 8 directs light to either photo diode 58 or 59 based on the phase difference between the light entering couplers 51A versus splitter 51B.

Phase differences between LCS signals are used to image the scene because the absolute phase of arriving light changes continually and rapidly, whereas the phase difference between adjacent LCS signals is constant as long as the scene is stable.

Figure 13:
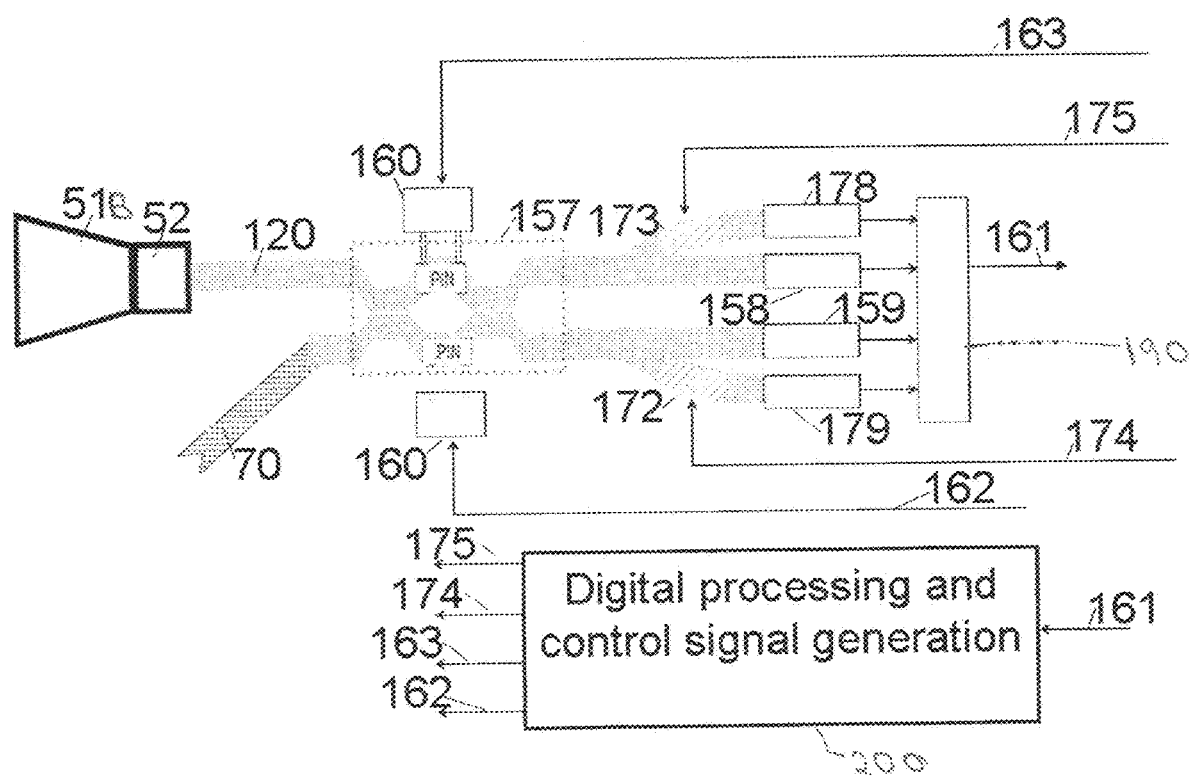
FIG. 13 is an illustration of an alternative light collection site implementation.

This section of the invention patent application implements an alternative means of finding a difference spectrum that represents an image of the scene. The alternative LCS implementation shown in FIG. 13 is somewhat more complex. When compared to the LCS illustrated in FIG. 8, additional photo diodes are needed, and each LCS now requires the addition of spectral filtering mechanisms. The benefit of this alternative implementation is that comparisons between LCS light streams are no longer needed, and it is easier to attain and maintain the zero phase and maximum signal condition labeled 114 in FIG. 12.

The period of the cosinusoidal variation depicted in FIGS. 5 and 12 equals a weighted-average of the wavelength of imaged light.

In FIG. 13, the coupler 51B and polarization diversifier 52 capture and conduct scene light to waveguide 120. Waveguide input 70 is used to input hardware-system generated light during non-imaging cycles to provide data representing non-uniform conditions.

Mack Zehnder Interferometer 157 splits input light, and the PIN diode and control circuitry 160 is varied using electrical inputs 162 and 163 to bring the split light in the two interferometer arms to zero delay (that is, the condition shown as 114 in FIG. 12). As will be discussed, in the FIG. 8 photonics circuit, zero delay can be defined in at least three ways.

Components 172 and 173 are spectral filters. Spectral filtering can be provided by etching Bragg Gratings into the waveguides, adding nano features onto the waveguides, or placing the add waveguide of small ring resonators in series with the interferometer waveguide These or other spectral filtering techniques are used to direct different spectrums of light to photo diodes 158 and 159 versus 178 and 179.

Control lines 174 and 175 are used to adjust the spectral filtering properties of 172 and 173 for uniformity across the LCS array. For example, control signals 174 and 175 might control the current in PIN diodes (that are not shown in FIG. 13) and thereby change the filtering characteristics of ring resonators. After adjustment using control signals 174 and 175, any remaining non-uniformities are quantified using input 70, and those non-uniformities are corrected during subsequent image processing before the image is displayed.

In FIG. 13, component 190 includes photo diode amplification, signal integration, and other electronics needed for signal frame storage, conditioning, row and column read, and signal reset. The multiple outputs from each LCS are represented by signal line 161 from the component 190 and input to a digital processing and control signal generation component 200.

In operation. the data to be Fourier Transformed is implemented in one of three ways. A zero-delay condition in the interferometer 157 can be defined for the spectrum reaching photodiodes 158 and 159, the spectrum reaching photodiodes 178 and 179, or the combined spectrums reaching photo diodes 158 plus 178 and 159 plus 179.

As an example, assume that photodiodes 158 and 159 are used to attain and maintain zero delay (114 in FIG. 12) for the light spectrum sensed by photo diodes 158 and 159. Then the signal in 158 is minimized, and the signal in 159 is maximized.

Regardless of the photo diodes used to establish a zero delay (158 and 159, 178 and 179, or 158 plus 178 and 159 plus 179), the (real, imaginary) input to the Fourier Transform that generates the image is the difference in photo diode signals (178-158, 179-159).

Generally, when used herein, the phrase correlation length refers to a time delay that will cause a split stream to correlate 1/e, or significantly better than two incoherent light streams. Fractions other than 1/e can be used in lieu of the noted 1/e value.

What is claimed is:

1. A two-dimensional plane wave imager (PWI) array comprising at least a first, second, and third interconnected light collection sites (LCS), the PWI array comprising:
    the first LCS further comprising:
        a first coupler for receiving an electromagnetic signal (EM) as reflected or emitted from a scene;
        a first polarization diversifier for receiving the electromagnetic signal from the coupler and for generating a single-mode electromagnetic signal;
        a first splitter for evanescently coupling inputs thereto;
        a second splitter that operates as a phase comparator;
        a first waveguide disposed between the first polarization diversifier and a first input of the first splitter;
        a first output of the first splitter coupled to the second LCS through a second waveguide;
        a second output of the first splitter coupled to a first input of the second splitter via a third waveguide;
        a second input of the second splitter coupled to the third LCS through a fourth waveguide;
        a first splitter output signal of the second splitter coupled to a first photodiode for producing a first photodiode output signal;
        a second splitter output signal of the second splitter coupled to a second photodiode for producing a second photodiode output signal; and
        a processor for processing the first and second photodiode output signals through a two-dimensional discrete Fourier transform to produce an image of the scene, the image based on an average of a first and second photodiode output when a phase delay between the first and second splitter output signals is less than a predetermined correlation length.

2. The two-dimensional plane waver imager array of claim 1 wherein the EM signal comprises scene light.

3. The two-dimensional plane waver imager array of claim 1 further comprising a first PIN diode disposed in the first waveguide and a second PIN diode disposed in the fourth waveguide, a first control voltage applied to the first PIN diode for controlling an effective optical length of the first waveguide and a second control voltage applied to the second PIN diode for controlling an effective optical length of the fourth waveguide.

4. The two-dimensional plane waver imager array of claim 1 wherein a ratio between a first splitter output signal and a second splitter output signal is based on an average of a phase difference between the first and second splitter output signals.

5. The two-dimensional plane waver imager array of claim 1 further comprising a display responsive to the discrete Fourier transform for displaying the image of the scene.

6. The two-dimensional plane waver imager array of claim 1 wherein a resolution of the image of the scene is responsive to length and width dimensions of the two-dimensional plane wave imager.

7. A plurality of two-dimensional plane waver imager arrays each array according to claim 1, each array imaging a same field of view to increase resolution of the scene in the field of view.

8. The plurality of two-dimensional plane waver imager arrays of claim 7 configured as a synthetic aperture array.

9. The two-dimensional plane waver imager array of claim 1 disposed in an exit pupil of a telescope.

10. The two-dimensional plane waver imager array of claim 1 wherein the first coupler comprises a first horn formed in a silicon substrate.

11. The two-dimensional plane waver imager array further comprising a plurality of light collection sites each one configured as the first LCS according to claim 1.

12. The two-dimensional plane waver imager array of claim 1 wherein the second and third LCS are located adjacent the first LCS.

13. The two-dimensional plane waver imager array of claim 1 formed in a silicon containing substrate.

14. The two-dimensional plane waver imager array of claim 1 wherein an optical path length from the first coupler of the first LCS to the second splitter of the first LCS is equal to an optical path length from a second coupler of the second LCS to the second splitter of the first LCS.

15. The two-dimensional plane wave imager array of claim 1 wherein the first coupler is etched on a silicon wafer, wherein a second wafer comprises the first polarization diversifier, the first and second splitters, the first, second, third, and fourth waveguides, the first and second photodiodes, and the processor, and wherein the second wafer is coupled to the first wafer such that an output of the first coupler is coupled to an input of the polarization diversifier.

16. The two-dimensional plane wave imager array of claim 1 further comprising a light source for providing non-uniformity correction by introducing light into a second input of the first splitter and determining respective responses of the first and second photodiodes thereto, and adjusting one or more parameters associated with operation of the first and second photodiodes and operation of the first and second PIN diodes.

17. A two-dimensional plane wave imager (PWI) comprising an array of light collections sites (LCS), the PWI comprising:
  each LCS comprising a coupler of scene light into an interferometer further comprising a first and a second output arm;
  the first and second output arms each split into two branch arms, thereby comprising first and second branch arms split from the first output arm, and third and fourth branch arms split from the second output arm;
  the first branch arm connected to a first spectral filter, and the fourth branch arm connected to a second spectral filter, each of the first and second spectral filters producing as an output two identical light spectra;
  an output of the first spectral filter, the second branch arm, the third branch arm, and an output of the second spectral filter each connected to a respective first, second, third and fourth photo diode, such that light spectra impinge each one of four photo diodes, and such that the first and second photo diodes sense interferometer outputs of the first output arm and third and fourth photo diodes sense interferometer outputs of the second output arm, in two light spectrum bands;
  control circuitry operative with the interferometer, to control the light in the first and second interferometer output arms to a zero delay condition for the light in either light spectrum or for a sum of the light spectra;
  sensing circuitry responsive to output signals from each of the first, second, third, and fourth photodiodes:
    to determine first output signal differences between spectral bands on an output of the first spectral filter and on an output of the second branch arm; or
    to determine second output signal differences between spectral bands on an output of the third branch arm and an output of the second spectral filter; or
    wherein a first sum comprises the output of the first spectral filter and the output of the second branch arm and a second sum comprises the out of the third branch arm and the output of the second spectral filter, to determine third output signal differences between the first and second sums; and
  the first, second, or third signal differences operative as (real, imaginary) inputs to a Fourier Transform component, wherein the Fourier Transforms represent an image of the scene.

18. The two-dimensional plane waver imager array of claim 17 further comprising a display responsive to a discrete Fourier transform for displaying the image of the scene.

19. The two-dimensional plane waver imager array of claim 17 wherein a resolution of the image of the scene is responsive to length and width dimensions of the two-dimensional plane wave imager.

20. The two-dimensional plane waver imager array of claim 17 wherein the coupler associated with each LCS comprises a first horn formed in a silicon substrate.

* * * * *